United States Patent
Mei et al.

(10) Patent No.: US 9,269,697 B2
(45) Date of Patent: Feb. 23, 2016

(54) SYSTEM AND METHODS FOR WARM WHITE LED LIGHT SOURCE

(75) Inventors: Zequn Mei, San Jose, CA (US); Xiantao Yan, Palo Alto, CA (US); Wu Jiang, Sunnyvale, CA (US)

(73) Assignee: LedEngin, Inc., San Jose, CA (US)

( * ) Notice: Subject to any disclaimer, the term of this patent is extended or adjusted under 35 U.S.C. 154(b) by 446 days.

(21) Appl. No.: 13/595,890

(22) Filed: Aug. 27, 2012

(65) Prior Publication Data

US 2013/0270585 A1    Oct. 17, 2013

Related U.S. Application Data

(60) Provisional application No. 61/624,054, filed on Apr. 13, 2012.

(51) Int. Cl.
| | |
|---|---|
| H01L 25/13 | (2006.01) |
| H01L 25/075 | (2006.01) |
| F21V 5/00 | (2015.01) |
| F21V 5/04 | (2006.01) |
| F21V 7/00 | (2006.01) |
| H01L 33/58 | (2010.01) |
| H01L 33/50 | (2010.01) |
| F21Y 113/00 | (2006.01) |

(52) U.S. Cl.
CPC ............ *H01L 25/0753* (2013.01); *F21V 5/004* (2013.01); *F21V 5/04* (2013.01); *F21V 7/0091* (2013.01); *F21Y 2113/007* (2013.01); *H01L 33/501* (2013.01); *H01L 33/58* (2013.01); *H01L 2224/48091* (2013.01); *H01L 2224/48463* (2013.01); *H01L 2924/0002* (2013.01)

(58) Field of Classification Search
CPC .................................................. H01L 25/0753
See application file for complete search history.

(56) References Cited

U.S. PATENT DOCUMENTS

| | | | |
|---|---|---|---|
| 5,001,609 A * | 3/1991 | Gardner et al. | ............... 362/555 |
| 6,967,447 B2 | 11/2005 | Lim et al. | |
| 8,075,165 B2 | 12/2011 | Jiang et al. | |
| 8,399,268 B1 | 3/2013 | Mei et al. | |
| 2005/0286264 A1 * | 12/2005 | Kim et al. | ...................... 362/600 |
| 2008/0123337 A1 * | 5/2008 | Higashi et al. | ................. 362/267 |
| 2009/0185107 A1 * | 7/2009 | Panagotacos | ........ G02B 3/0006 349/64 |
| 2010/0060185 A1 | 3/2010 | Van Dujineveldt | |
| 2010/0091491 A1 | 4/2010 | Jiang et al. | |
| 2010/0208490 A1 * | 8/2010 | Tsuchiya | ............. G02B 6/0096 362/606 |
| 2010/0259930 A1 | 10/2010 | Yan | |
| 2012/0286669 A1 | 11/2012 | Yan et al. | |
| 2012/0286699 A1 | 11/2012 | Yan et al. | |

* cited by examiner

*Primary Examiner* — Yu Chen
(74) *Attorney, Agent, or Firm* — Kilpatrick Townsend & Stockton LLP (57) ABSTRACT

An LED light emitter includes a single emitter structure having a substrate with a plurality of light emitting diodes (LEDs) arranged thereon, wherein the plurality of LEDs includes at least one first LED die that produces a first color light, and at least one second LED die that produces a second color light. The LED light emitter also includes a total internal reflection (TIR) lens positioned to collect light emitted from the single emitter structure and adapted to mix the light from the plurality of LEDs to produce a uniform light. The plurality of LEDs are selected such that the light output by the LED light emitter has a desired color temperature when an equal current is supplied to all of the plurality of LEDs.

6 Claims, 10 Drawing Sheets

| Specifications | Lumen/W | CCT | CRI | Color and intensity uniformity |
|---|---|---|---|---|
| Results | 80 | 2900 | 90 | Exceptional |

| 12-die (8 white + 4 red) | | Total units: 1000 | | | | | | | | | |
|---|---|---|---|---|---|---|---|---|---|---|---|
| | mA | volt | Radiometric, W | Lumen | x | y | CCT, K | Planck Distance | CRI | R9 | Watt | Lm/W |
| Average | 350 | 33.4 | 3.94 | 1290 | 0.4434 | 0.3944 | 2814 | 4.6E-03 | 89.0 | 79.8 | 11.7 | 110.5 |
| Stdev | | 0.4 | 0.02 | 11 | 0.0018 | 0.0020 | 22 | 6.7E-04 | 0.6 | 4.0 | 0.2 | 2.1 |
| Max | | 34.0 | 3.98 | 1317 | 0.4474 | 0.3999 | 2869 | 6.1E-03 | 89.9 | 86.7 | 11.9 | 116.6 |
| Min | | 32.2 | 3.89 | 1262 | 0.4394 | 0.3895 | 2765 | 2.9E-03 | 87.6 | 71.9 | 11.3 | 106.9 |
| Average | 700 | 36.2 | 7.10 | 2260 | 0.4454 | 0.3896 | 2742 | 6.7E-03 | 87.4 | 68.2 | 25.3 | 89.2 |
| Stdev | | 0.5 | 0.05 | 27 | 0.0022 | 0.0018 | 30 | 6.3E-04 | 0.6 | 4.5 | 0.4 | 2.1 |
| Max | | 37.0 | 7.22 | 2331 | 0.4511 | 0.3945 | 2813 | 8.7E-03 | 88.5 | 76.1 | 25.9 | 95.5 |
| Min | | 34.9 | 7.00 | 2201 | 0.4413 | 0.3845 | 2692 | 5.3E-03 | 86.1 | 57.6 | 24.4 | 85.3 |

FIG. 15

SYSTEM AND METHODS FOR WARM WHITE LED LIGHT SOURCE

CROSS-REFERENCES TO RELATED APPLICATIONS

This application claims priority to U.S. Provisional Patent Application No. 61/624,054, filed Apr. 13, 2012, commonly owned and incorporated herein by reference in its entirety. This application is also related to U.S. patent application Ser. No. 13/338,912, filed Dec. 28, 2011 and U.S. patent application Ser. No. 13/338,936, filed Dec. 28, 2011, commonly owned and disclosures from both of which are incorporated herein by reference in their entirety.

BACKGROUND OF THE INVENTION

The present disclosure relates generally to lighting devises and methods for manufacturing and in particular to an LED-based light source for emitting bright warm light.

As light-emitting diode (LED)-based lighting sources become popular, more customers are demanding higher CRI warm white light sources with CRI greater than 80, 90, or even higher. A conventional lamp fixture to achieve warm white light includes multiple off-white LED emitters and red LED emitters, wherein each LED emitter has an LED semiconductor chip on a substrate capped with a primary lens. Alternatively, an LED emitter for warm white color can be made with a mixture of yellow and red phosphors pumped by blue LED chips. Both of these approaches have their limitations, as described in more detail below.

Therefore, it would be desirable to provide an improved LED-based light source.

BRIEF SUMMARY OF THE INVENTION

As described above, conventional LED-based light sources are inadequate in meeting the requirements for bright warm white light. The conventional LED lamp with mixed off-white emitters and red emitters suffer from many limitations. These limitations include, for example, (1) a diffuser is needed for mixing red and the off-white emitters, which reduces the lumen efficiency; and (2) collimation of the lamp light is difficult because the off-white and red emitters are located over a large area in the light source. As a result, the conventional LED warm white lamps tend to have good CRI, but have low brightness and are not suited for narrow beam applications.

The conventional warm white LED emitter having a mixture of yellow and red phosphors pumped by blue LED chips suffer from low efficiency in part because the currently available red phosphor, which needs to be thermally stable, has low lumen efficiency, for example, 30 lm/W, or so. To make matters even worse, LED blue chip vendors are reducing the blue chip wavelengths, for example, from 460-470 nm to 440-450 nm. To achieve higher CRI using shorter wavelength blue requires red the phosphor with longer wavelength, resulting in even lower luminous efficiency. Further, the manufacturing yield tends to be low with disposing yellow and red phosphors on blue LED chips in a partially assembled LED emitter. The variations in the emitters and phosphors make it difficult to achieve the desired light color.

The numbers and the driving currents through the different color light sources need to be selected to obtain the desirable output color. In the multiple emitter approach, the driving currents in the emitters need to be adjusted in order to obtain the desired color. In the multiple-chip single emitter approach, the driving currents in chip need to be adjusted in order to obtain the desired color. Adjusting the current require additional circuitry, increasing the complexity and cost of the product.

Embodiments of the present invention provide a single emitter structure with mixed LED dice which generate white light and red light, rather than mixing individual emitters, combined with a color mixing TIR (total internal reflection) lens. Embodiments of the invention also provide methods for forming emitters with high lumen efficiency warm white. Embodiments of this invention have been applied to form 9-die, 12-die, and 24-die emitters of warm white with high lumen efficiency, high CRI and R9. It is noted that CRI refers to Color Rendering Index, and R9 is the CRI with respect to the red color. Further, embodiments of the invention also include methods for forming LED dice for use in a single emitter for generating desired light color and brightness. Note that, as used herein, an "emitter" refers to a packaged structure having one or more LED dice mounted on a substrate and often including a primary lens.

The following detailed description together with the accompanying drawings will provide a better understanding of the nature and advantages of the present invention.

DETAILED DESCRIPTION OF THE INVENTION

Embodiments of the present invention provide a single emitter structure with mixed LED dice which generate greenish and red light, rather than mixing emitters, combined with a color mixing total internal reflection lens. Embodiments of the invention also provide methods for forming emitters with high lumen efficiency warm white. Embodiments of this invention have been applied to form 9-die, 12-die, and 24-die emitters of warm white with high lumen efficiency, high CRI and R9. Other emitter configurations can also be formed using methods for forming LED dice for use in a single emitter for generating desired light color and brightness according to embodiments of the invention also include.

Figure 1:
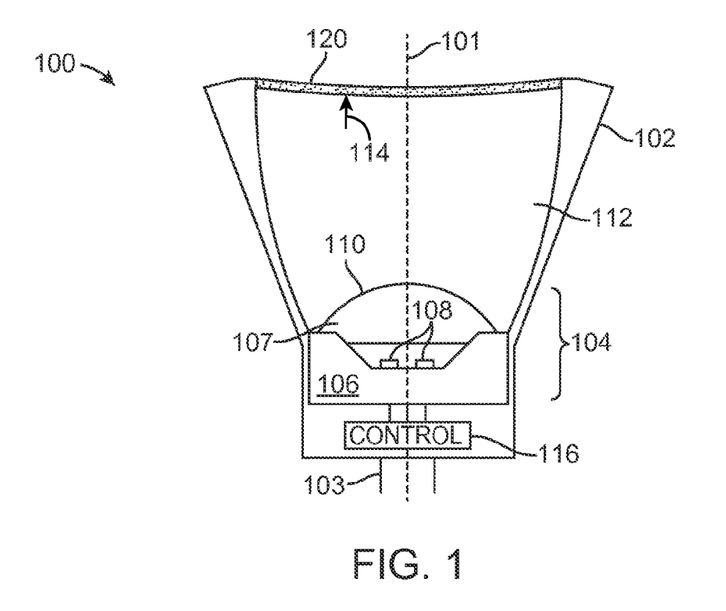
FIG. 1 is a simplified cross-sectional side view of an LED-based lamp according to an embodiment of the present invention.

FIG. 1 is a simplified cross-sectional side view of an LED-based lamp 100 according to an embodiment of the present invention. Lamp 100, which is cylindrically symmetric about an axis 101, has a housing 102, which can be made of aluminum, other metals, plastic, and/or other suitable material. Housing 102 holds the various components of lamp 100 together and can provide a convenient structure for a user to grip lamp 100 during installation or removal from a light fixture. The exterior of housing 102 can include mechanical and/or electrical fittings 103 to secure lamp 100 into a light fixture and/or to provide electrical power for producing light. In some embodiments, housing 102 may include fins or other structures to facilitate dissipation of heat generated during operation of lamp 100. The exterior shape of housing 102 can be made to conform to a standard lamp form factors.

Within housing 102 is an emitter package 104. Package 104 includes a substrate 106 in which is formed with a recess 107. Substrate 106 can be a multilayer structure with ceramic and metal layers. Examples are described in U.S. Patent Application Pub. No. 2010/0259930, the disclosure of which is incorporated herein by reference. Other substrates can also be used.

LEDs 108 are mounted on substrate 106 within recess 107. In some embodiments, the top surface of recess 107 is patterned with a number of metal pads, each accommodating a single LED 108. Each LED 108 can be a separate semiconductor die structure fabricated to produce light of a particular color in response to electrical current. In some embodiments, LEDs 108 can be covered with a material containing a color-shifting phosphor so that LED 108 produces light of a desired color. For example, a blue-emitting LED die can be covered with a material containing a yellow phosphor; the emerging mixture of blue and yellow light is perceived as white light having a particular color temperature. As described below, in some embodiments different ones of LEDs 108 can produce light of different colors; LEDs 108 need not be identical.

Lamp 100 also includes a primary lens 110, which can be made of glass, plastic, or other optically transparent material, that is positioned to direct light emitted from LEDs 108 into secondary optics 112. Secondary optics 112 advantageously include a total-internal-reflection (TIR) lens that also provides mixing of the colors of light emitted from LEDs 108 such that the light beam exiting through front face 114 has a uniform color. Examples of suitable lenses are described in U.S. Patent Application Pub. No. 2010/0091491, the disclosure of which is incorporated herein by reference; other color-mixing lens designs may also be used.

In some embodiment, optionally lamp 100 can also include a diffusive coating 120 on front face 114 of lens 112. Coating 120 provides further color mixing of the light exiting secondary optics 112 without requiring additional space, a significant consideration when designing a lamp with a compact form factor. Various coatings 120 can be used. In some embodiments, coating 120 can be a holographic diffuser film, such as a light-shaping diffuser film made by Luminit Co. of Torrance, Calif. (website at www.lumintco.com). In these films, the diffusive coating is provided as a diffusive material disposed in a desired pattern on an optically transparent substrate film (e.g., acrylic, polyester, polycarbonate, glass or fused silica). The film is easily applied to front face 114. Other types of coatings can also be applied; for example, diffusive material can be applied directly to front face 114.

In some embodiments, lamp 100 includes a control circuit 116 that controls the power provided from an external power source (not shown) to LEDs 108. In some embodiments, control circuit 116 allows different amounts of power to be supplied to different LEDs 108, allowing for tuning of the color as described below.

Figure 2:
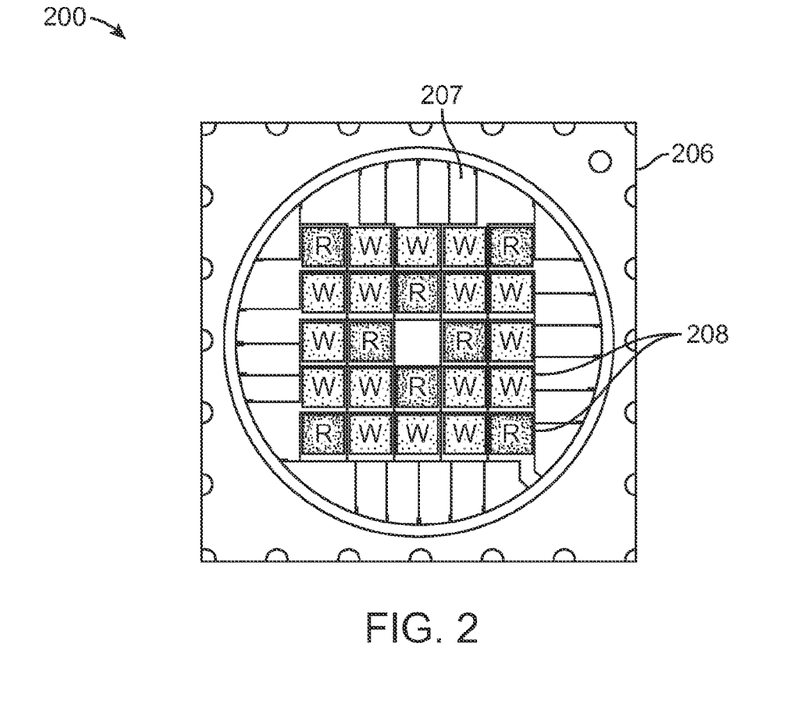
FIG. 2 is a simplified top view of a 24-die LED package that can be used in the lamp of FIG. 1 according to an embodiment of the present invention.

FIG. 2 is a simplified top view of a 24-die emitter 200 implementing emitter package 104 of FIG. 1 according to a specific embodiment of the present invention. In this embodiment, substrate 206 includes a recess 207 in which 24 LEDs are disposed as shown. It can be seen that 16 white LED dice (W) and eight red LED dice (R) are arranged in a 5×5 grid symmetrically with respect to the center grid, with four red LEDs (R) placed in the corners and four red LEDs (R) adjacent to the center grid.

In some embodiments, each white LED die includes a blue light LED chip with a wavelength-converting layer disposed directly thereon, and each red LED die includes a red light LED chip. In some embodiments, the white LED dice are selected to produce an off-white color, e.g., a greenish white color, with a desired amount of wavelength-converting material is disposed directly on the blue light LED chip. When light from white LED dice (W) and red LED dice (R) is mixed by mixing lens 112, warm white color temperature can be achieved. In some embodiments, the white LED dice are selected such that the light output by the LED light emitter has a desired warm white color temperature when the number of white LED dice is twice the number of red LED dice, and an equal current is supplied to all of the plurality of LEDs. In some embodiments, the white LED dice are selected such that a desired amount of wavelength-converting material is disposed directly on the blue light LED chip.

A method for selecting the white LED dice according to embodiments is described below. Additional examples of techniques for selecting LEDs for an emitter to provide a desired output color are described, e.g., in U.S. patent application Ser. No. 13/240,796, the disclosure of which is incorporated herein by reference.

As used herein, "cool" white and "warm" white refer to the color temperature of the light produced. Cool white, for example, can correspond to a color temperature above, e.g., about 4000 K, while warm white can correspond to a color temperature below, e.g., about 3000 K. Further, the terms "white light" or "white color", as used herein, can refer to a broad range of whitish colors or light, for example, cool white, warm white, greenish white, and reddish white, etc.

In some embodiments, LEDs 208 are advantageously provided with electrical connections such that different groups of the LEDs are independently addressable, i.e., different currents can be supplied to different groups of LEDs. These electrical connections can be implemented, e.g., using traces disposed on the surface of substrate 206 and/or between electrically insulating layers of substrate 206.

Where the different LED groups are interpendently addressable, package 200 provides an emitter that can be tuned to produce light of a desired color (e.g., color temperature) by adjusting the relative current delivered to different groups of LEDs 208, e.g., using control circuit 116. Techniques for tuning an emitter have been described, e.g., in U.S. patent application Ser. No. 13/106,808 and U.S. patent application Ser. No. 13/106,810, the disclosures of which are incorporated herein by reference.

In other embodiments, the color temperature of the light produced by the lamp can be controlled by selecting the LEDs such that the desired color (e.g., color temperature) is achieved when equal currents are supplied to all LEDs 208. In other embodiments, the color temperature of the light produced by the lamp can be controlled by selecting white LED dice (W) and red LED dice (R) such that the desired color (e.g., color temperature) is achieved when equal currents are supplied to all LEDs. Selection of LEDs for a given substrate can be done by testing individual LED dice prior to substrate assembly to determine the color temperature of light produced and binning the LED dice according to color temperature. Accordingly, color tuning by adjusting the relative current supplied to different groups of LEDs is not required.

In the embodiment of FIG. 2, the LEDs are arranged to provide a roughly uniform circular distribution of the LEDs. That is, the white and red LEDs are intermixed and arranged such that warm and cool light are produced in approximately equal intensities across different parts of the emitter substrate. This allows for optimal color mixing using secondary optics such as TIR lens 112 of FIG. 1, to produce a uniformly white light from LEDs that are not uniform in color.

Figure 3:
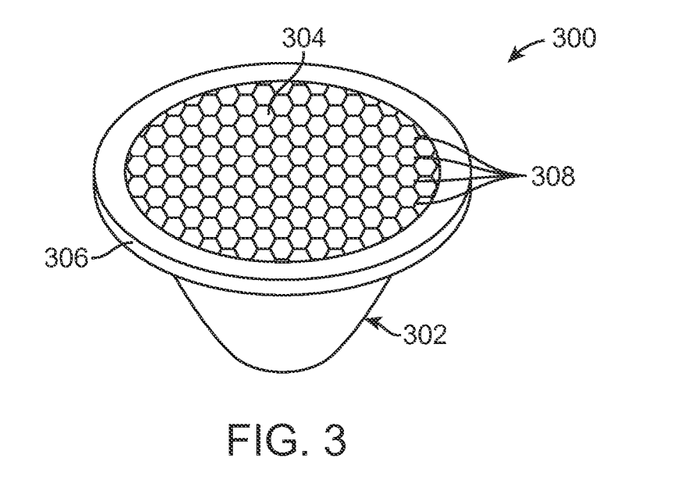
FIGS. 3, 4, and 5A-5C are simplified drawings illustrating TIR lenses according to embodiments of the present invention.
Figure 4:
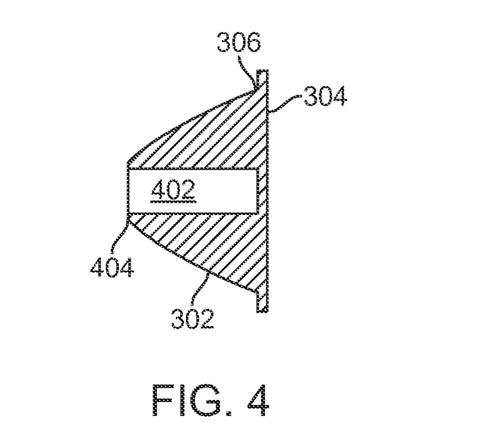

FIGS. 3, 4, and 5A-5C illustrate TIR lenses according to embodiments of the present invention. FIG. 3 is a perspective view of a TIR lens 300 that can be used in secondary optics 112 of lamp 100 of FIG. 1 according to an embodiment of the present invention, and FIG. 4 is a cross-section side view of TIR lens 300. TIR lens 300 can be made of an optically transparent material such as glass or plastic (e.g., polymethylmethacrylate (PMMA)) and can be manufactured, e.g., using conventional processes such as molding processes in the case of a plastic lens. TIR lens 300 has a smooth side wall 302, a top face 304 and a flange 306. As shown in FIG. 4, a central cavity 402 is created inside lens 300, extending partway to top face 304. Cavity 402 is open at the bottom, and primary lens 110 of package 104 (FIG. 1) can extend into cavity 402. Bottom edge 404 of lens 300 can be sized and shaped to contact the edges of package 104 surrounding primary lens 110, as shown schematically in FIG. 1. This provides alignment of the package with respect to the TIR lens.

Figure 5A:
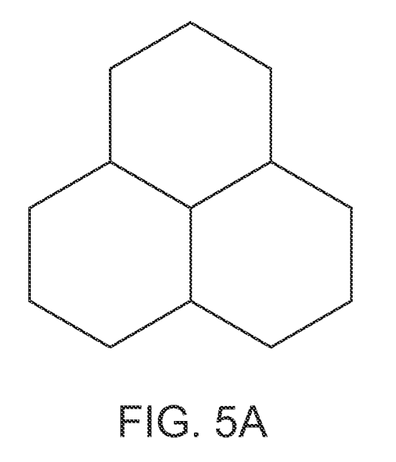
Figure 5B:
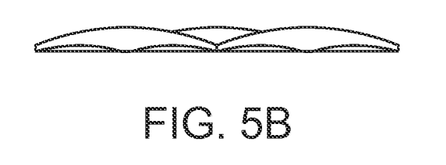

As shown in FIG. 3, top face 304 of lens 300 is patterned with hexagonal microlenses 308. An example of the hexagonal pattern is shown in FIG. 5A. Microlenses 308 provide beam shaping, and the pattern can be chosen to create a desired beam width. In FIG. 4, each microlens 308, however, has a convex curvature as shown in FIG. 5A, providing small local excursions from the contour of top face 304.

Figure 5C:
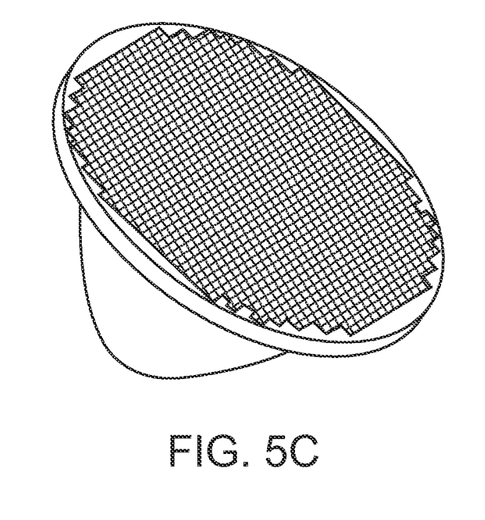

As noted above, a diffusive coating, such as a holographic diffuser film, can be applied over top face 304. However, in specific embodiments for bright light output, a diffusive coating is not used. In some embodiments of the above LED light emitter, the TIR lens has a front surface having a plurality of convex microlenses thereon. In some embodiments, each of the convex microlenses comprises a plurality of dimples. In some embodiments, each of the convex microlenses comprises a plurality of dimples formed by sand blasting the color mixing lens. In some embodiments, each of the convex microlenses comprises a frosted surface. In a specific embodiment, each of the convex microlenses comprises a frosted surface formed by sand blasting the TIR lens. In an embodiment, the frosted surface is formed by sand blasting using grit 280. FIG. 5C shows a perspective view of a TIR lens according to an embodiment of the present invention.

Side wall 302 can be shaped to optimize total internal reflection for an emitter disposed at a position determined by bottom edge 404 and cavity 402. In some embodiments, side wall 302 of lens 300 can be coated with a reflective material, or a reflective housing can be placed around sidewall 302 to reduce light loss through side wall 302.

Flange 306 extends peripherally from top face 304 and can be used to secure lens 300 in a housing such as housing 102 of FIG. 1. In some embodiments, flange 306 does not affect the optical properties of lens 300; the size and shape of flange 306 can be modified based on mechanical design considerations (e.g., retention of the lens within the housing of an assembled lamp).

The beam angle produced by lens 300 can controlled by suitable selection of various design parameters for the lens, in particular the size and shape of microlenses 308. Examples of the effects of changing a microlens pattern and other lens design parameters are described, e.g., in U.S. Pat. No. 8,075,165, the disclosure of which is incorporated herein by reference. The particular configuration shown in FIGS. 3, 4, and 5A-5C can result in light with a narrow beam, but other configurations can provide different beam angles.

While the invention has been described with respect to specific embodiments, one skilled in the art will recognize that numerous modifications are possible. For example, the emitter can include a different number or arrangement of LEDs. The LEDs can be arranged in various ways; in some embodiments, rotationally symmetric arrangements (e.g., as shown in FIG. 2) are preferred for optimum color mixing. Use of a single emitter with multiple LEDs in combination with a color-mixing lens and provides uniform color of a desired temperature. Additional embodiments are described below.

Embodiments of the present invention provides an LED light emitter that includes a single emitter structure and a total internal reflection (TIR) lens. The single emitter structure has a substrate with a plurality of light emitting diodes (LEDs) arranged thereon, wherein the plurality of LEDs includes at least one white LED die that produces a white light, and at least one red LED die that produces a red light. Each white LED die includes a blue light LED chip with a wavelength-converting layer disposed directly thereon, and each red LED die includes a red light LED chip. A total internal reflection (TIR) lens is positioned to collect light emitted from the single emitter structure and adapted to mix the light from the plurality of LEDs to produce a uniform white light. In the light emitter, the white LED dice are selected such that the light output by the LED light emitter has a desired color temperature when the number of white LED dice is twice the number of red LED dice, and an equal current is supplied to all of the plurality of LEDs.

Methods for a wavelength-converting layer disposed directly on an LED chip are described in U.S. patent application Ser. No. 13/338,912, filed Dec. 28, 2011 and U.S. patent application Ser. No. 13/338,936, filed Dec. 28, 2011, U., commonly owned and disclosures from both of which are incorporated herein by reference in their entirety.

In some embodiments of the above LED light emitter, the white LED dice are selected such that a desired amount of wavelength-converting material is disposed directly on the blue light LED chip such that the light output by the LED light emitter has a desired color temperature when the number of white LED dice is twice the number of red LED dice, and an equal current is supplied to all of the plurality of LEDs.

In a specific embodiment, the plurality of LEDs consists of 16 white LED dice and eight red LED dice arranged symmetrically in a 5×5 grid, with four red LEDs placed in corners. In an alternative embodiment, the plurality of LEDs consists of eight white LED dice and four red LED dice arranged symmetrically in a 4×4 grid, with the four red LEDs placed in the periphery.

In some embodiments of the above LED light emitter, the TIR lens has front surface having a plurality of convex microlenses thereon. In some embodiments, each of the convex microlenses comprises a plurality of dimples. In some embodiments, each of the convex microlenses comprises a plurality of dimples formed by sand blasting the color mixing lens. In some embodiments, each of the convex microlenses comprises a frosted surface. In a specific embodiment, each of the convex microlenses comprises a frosted surface formed by sand blasting the TIR lens.

Figure 6:
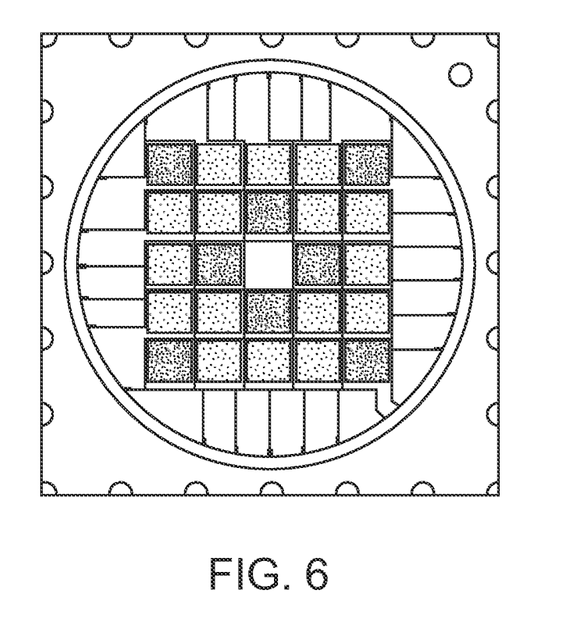
FIGS. 6-10 are simplified top view diagrams illustrating arrangements of white and red LED dice in various embodiments of the present invention.
Figure 7:
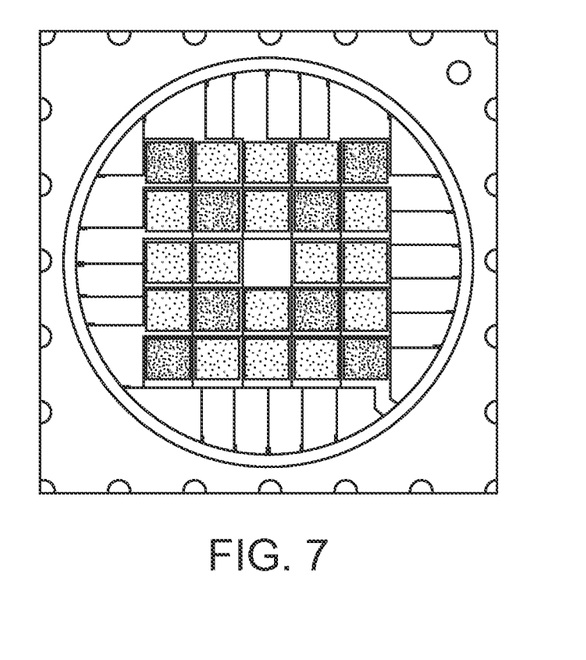
Figure 8:
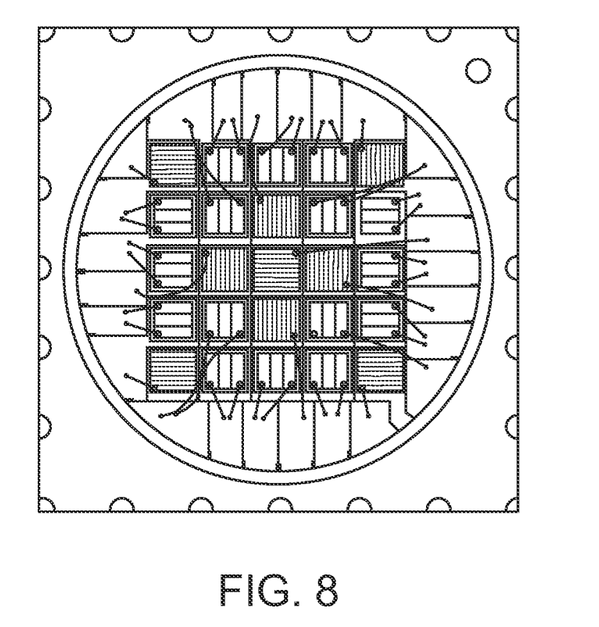
Figure 9:
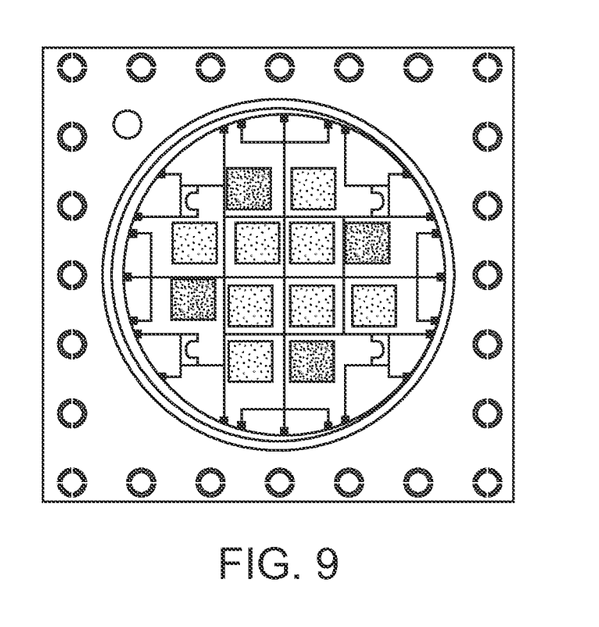
Figure 10:
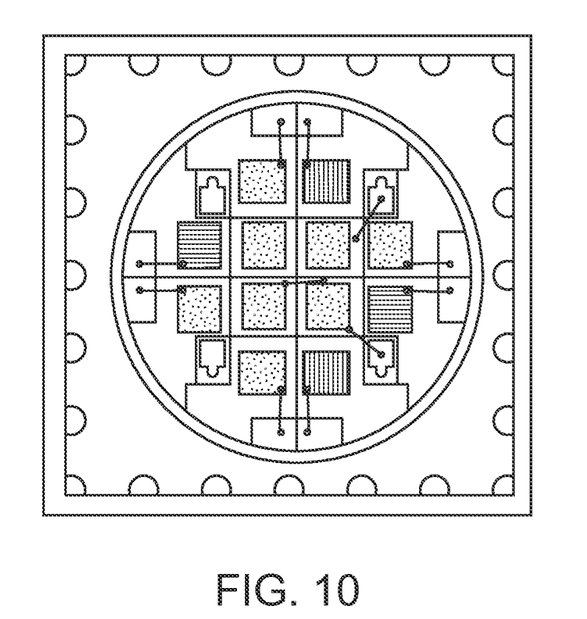

FIGS. 6-10 are simplified top view diagrams illustrating arrangements of white and red LED dice in various embodiments of the present invention. FIG. 6 shows a top view of an emitter with 24 LED dice—16 white light LED dice and 8 red light LED dice arranged in a 5×5 grid. In some embodiments, these LED dice can be grouped into four channels that are individually addressable. In some other embodiments, these LED dice can be connected to receive identical driving current. FIG. 7 shows a top view of an emitter with 24 LED dice—16 white LED dice and 8 red LED dice in an alternative arrangement. FIG. 8 shows a top view of an emitter with 24 LED dice in yet another arrangement. The emitter includes 16 white LED dice, 8 red LED dice, and a center grid that can be a red light LED die, an optical sensor, or an empty grid. FIG. 9 shows a top view of an emitter with 12 LED dice—8 white LED dice and 4 red LED dice. In some embodiments, these LED dice can be grouped into two channels that are individually addressable. In some other embodiments, these LED dice can be connected to receive identical driving current. FIG. 10 shows the top view of an emitter with 12 LED dice—8 white LED dice and 4 red LED dice in an alternative arrangement.

Figure 11:
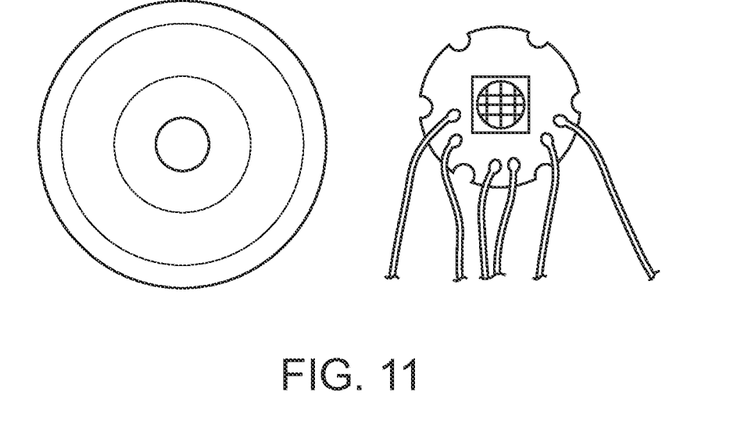
FIG. 11 shows top views of a TIR lens and an emitter with a primary lens disposed on a substrate according to an embodiment of the present invention.

FIG. 11 shows top views of a color mixing TIR lens and an emitter with a primary lens disposed on a substrate according to an embodiment of the present invention. Color mixing and resulted color uniformity is critical for the high luminous efficacy. Although the characteristic of the small form factor of the emitter substrates facilitate the color mixing inherently, conventional lenses do not achieve the satisfactory color mixing. This invention also includes a new design of the mixing lens, with the good color mixing, low loss, and the same size with the family of the associated substrate. More details of the color-mixing lens are described above in connection to FIGS. 3, 4, and 5A-5C.

Figure 12:
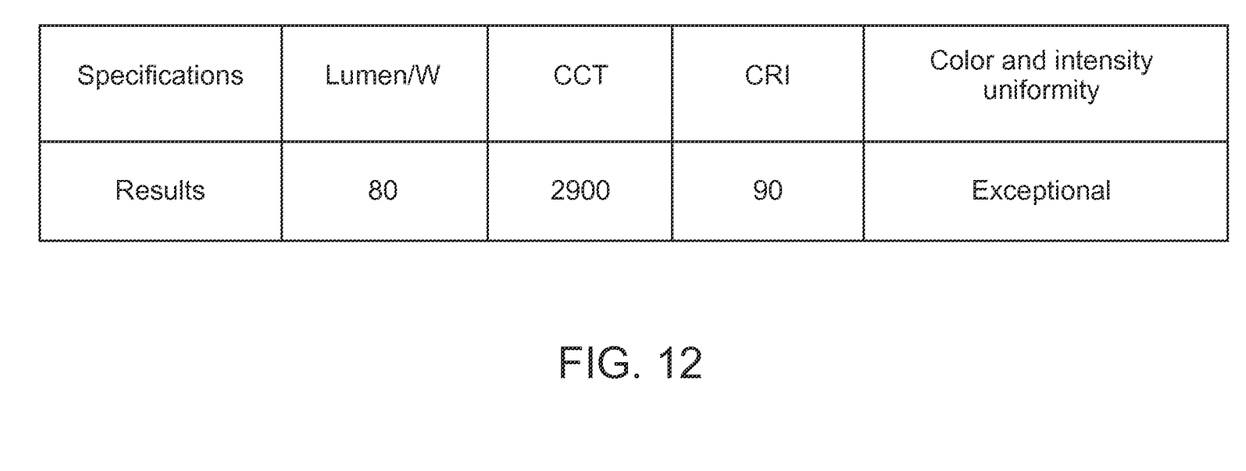
FIG. 12 lists performance measurements of warm light emitters according to embodiments of the invention.

Embodiments of the invention combine a high lumen per watt emitter with a high efficiency TIR lens to provide a warm white light source with the best performance known to date in terms of lumens per watt, color quality, and color intensity uniformity. FIG. 12 lists some of the performance measurements of warm light emitters according to embodiments of the invention. It can be seen that 80 Lumens/W, CCT of 2900, and CRI of 90 can be achieved.

Figure 13:
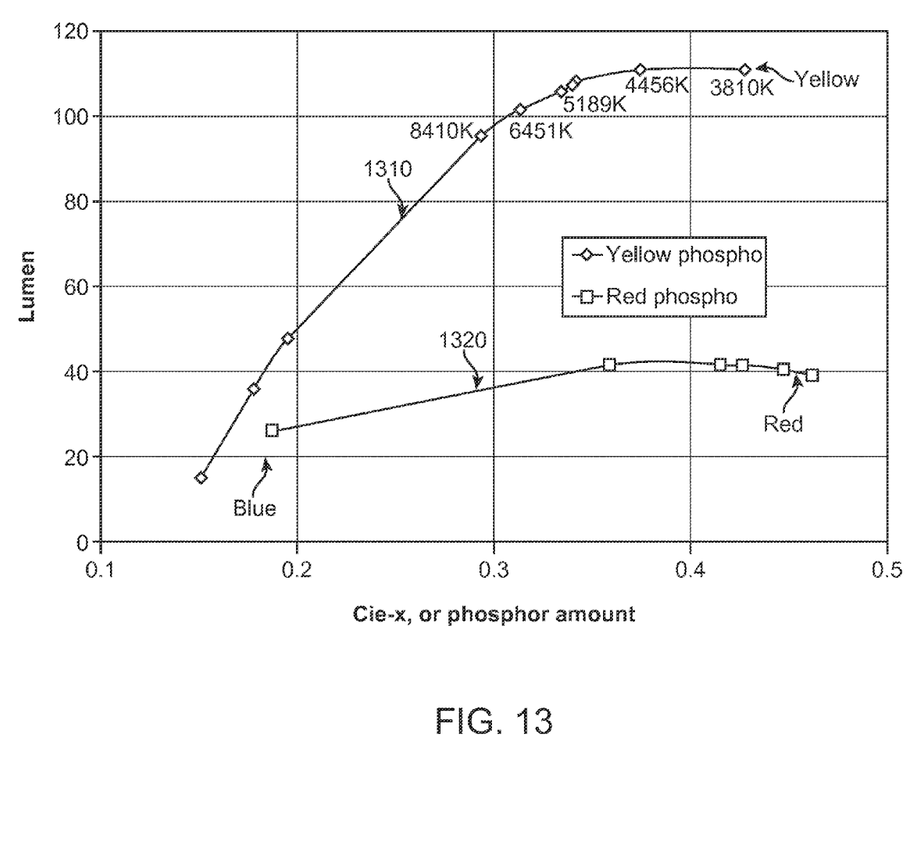
FIG. 13 illustrates variation of brightness of light output of a blue light LED chip with different amount of phosphor according to an embodiment of the invention.

FIG. 13 illustrates variation of brightness of light output of a blue light LED chip with different amount of phosphor according to an embodiment of the invention. The top curve 1310 shows the brightness of light (Lumen) obtained with a blue LED with increasing amount of yellow phosphor (Cie-x), as the output light color changes from blue to yellow. It can be seen that the brightness increases with increasing amount of phosphor and reaches a plateau in a region with Cie-x of about 0.35 to about 4.3. Beyond this region, the brightness starts to decrease, in part because of light scattering caused by the higher amount of phosphor. The bottom curve 1320 shows the brightness of light obtained with a blue LED with increasing amount of red phosphor, as the output light color changes from blue to red. It can be seen that the brightness also reaches a plateau with increasing amount of phosphor in a region with Cie-x of about 0.35 to about 4.3. Therefore, according to embodiments of the present invention, in order to obtain bright output light, the LED chips are selected in the region of the greatest brightness in the Lumen vs. Cie-x chart. In addition, FIG. 13 also shows that blue LED with red phosphor (1320) exhibits much lower brightness than blue LED with yellow phosphor (1310). Therefore, in a light source with a combination of these two LED chips, it is desirable to increase the number of blue LEDs with yellow phosphor and reduce the number of blue LEDs with red phosphor.

Figure 14:
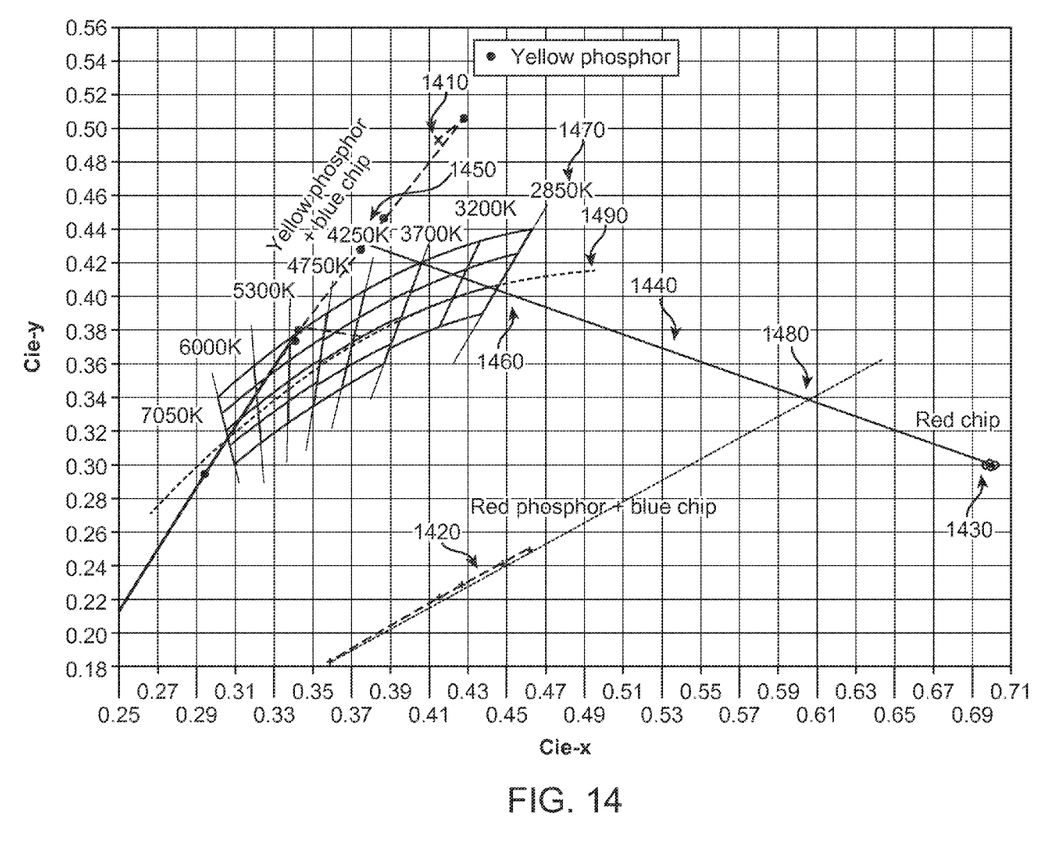
FIG. 14 illustrates a method for selecting a combination of different light sources to achieve a desirable output light color with high brightness according to embodiments of the present invention.

FIG. 14 illustrates a method for selecting a combination of different light sources to achieve a desirable output light color with high brightness according to embodiments of the present invention. The curve for blue LED with yellow phosphor on the left 1410 is shown to have two sections. The upper section of line 1410 corresponds to the plateau region in FIG. 13 that exhibits high brightness, and is suitable for use in high brightness light sources. The red LED semiconductor chip is shown as a single point 1430 to the right. The line 1440 connecting the red LED chip point 1430 with a point 1450 in curve 1410 designates the color variation that can be obtained as the relative brightness of these two light sources is varied. The relative brightness can be obtained by varying the number of each LED, by varying the driving current in each LED, or by a combination of these two parameters.

According to a specific embodiment of the present invention, for example, the intersection point 1460 between line 1440 with the 2850K color temperature line 1470 can be achieved with twice the number of light source 1450 as the number of red light source 1430 driven by the same current. Note that color point 1460 is a desirable warm white light color that is substantially at the intersection of the 2850K color temperature line 1470 and the black body color line 1490. This simple combination of 2:1 ratio in numbers of two difference LED dice enables flexible and efficient emitter designs. For example, embodiments of this invention have been applied to form 9-die, 12-die, and 24-die emitters of warm white. In some embodiments, the white LED dice are selected to produce greenish white color 1450 with a desired amount of wavelength-converting material is disposed directly on the blue light LED chip.

According to embodiments of the present invention, a light source that emits light at color point 1450 can be formed using a blue light LED chip with appropriate amount of phosphor according to an embodiment of the invention. Methods for forming a layer of wavelength converting material directly on an LED die are described in U.S. patent application Ser. No. 13/338,912, filed Dec. 28, 2011 and U.S. patent application Ser. No. 13/338,936, filed Dec. 28, 2011, commonly owned and disclosures from both of which are incorporated herein by reference in their entirety.

In an alternative, instead of using the red light LED 1430, a combination of red phosphor and blue light chip can be used. In this case, sufficient amount of red phosphor needs to be used to reach point 1480 on line 1440. The target warm light point 1460 can be obtained by varying the brightness of light sources 1450 and 1480. Note that 1480 is closer to the yellow phosphor line 1410 than the red LED chip. Therefore, in a combination, a higher number of light sources 1480 will be needed. In other words, more red phosphor/blue light chip combination will be needed. As described above in connection with FIG. 13, the Lumen number for such a combination is low, causing the resulting lamp to suffer from low brightness. Therefore, in embodiments of the present invention, for the red light source, a red light LED chip is preferred over the red phosphor/blue light chip combination.

Figure 15:
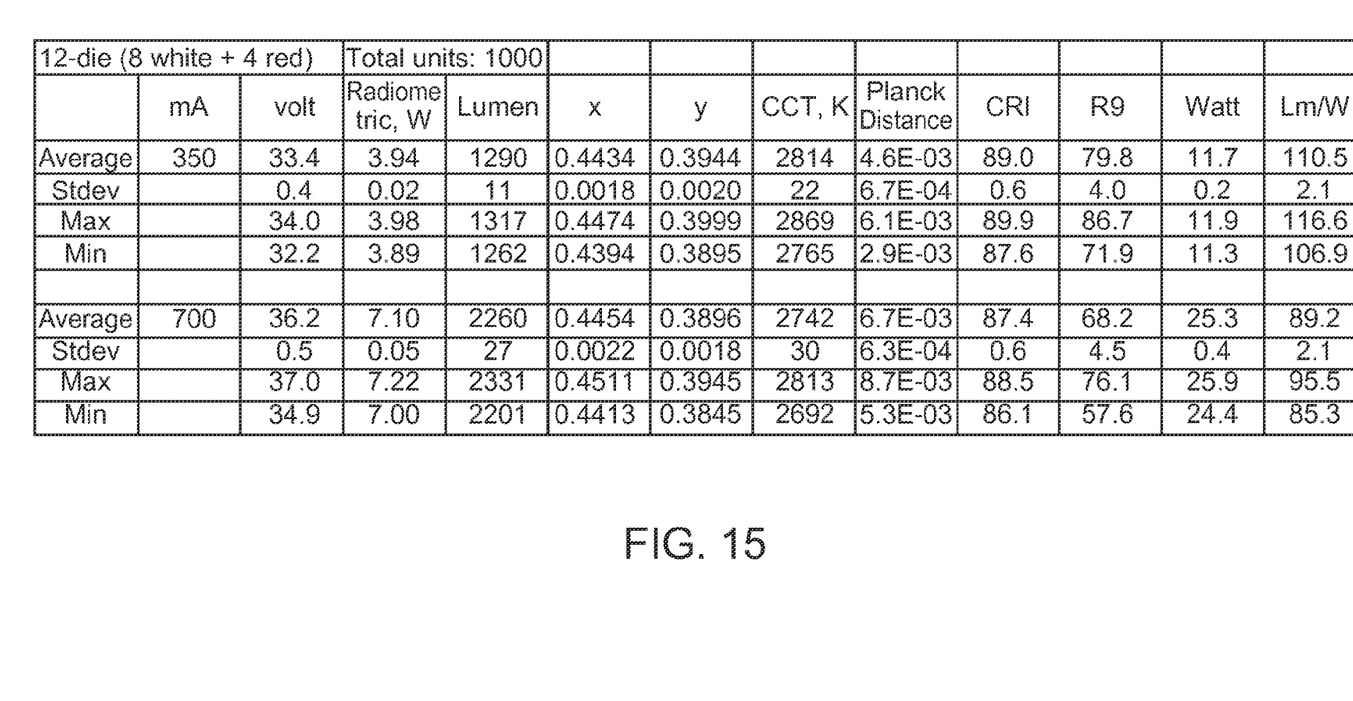
FIG. 15 lists examples of performance data for various embodiments of the invention.

FIG. 15 lists more examples of performance data for various embodiments of the invention. It can be seen that the emitter and lens combinations according to embodiments of the invention provide excellent performance parameters, such as luminous efficiency, CRI (Color Rendering Index), CRI09 (Color Rendering Index for the red color), CCT (color temperature), and others.

Depending on the embodiments, one or more of additional advantages can be achieved, including simplified design with 2:1 ratio of two types of LEDs and a single drive current. The 2:1 ratio allows for design flexibility. For example, embodiments of the invention have been applied to 9-die, 12-die, and 24-die emitters. The single emitter structure provides a small light source with multiple LED dice providing high luminous efficiency and enables narrow beam light collimation. With the color-mixing lens, high output light uniformity is provided without the need for a diffuser. The frosted surface of the lens further scatters the light to improve light uniformity. In addition, the substrate of the single emitter structure is configured for efficient heat dissipation that enables high current drive for greater brightness.

As described above, embodiments of the present invention provides devices and methods for LED emitters for producing bright light of a desired color by selecting a combination of LEDs when an equal current is supplied to all of the plurality of LEDs. According to some embodiments, a method for forming an LED light emitter includes forming a single emitter structure having a substrate with a plurality of light emitting diodes (LEDs) arranged thereon, wherein the plurality of LEDs includes at least one first LED die that produces a first color light, and at least one second LED die that produces a second color light. The method also includes forming a total internal reflection (TIR) lens positioned to collect light emitted from the single emitter structure and adapted to mix the light from the plurality of LEDs to produce a uniform light. The plurality of LEDs are selected such that the light output by the LED light emitter has a desired color temperature when an equal current is supplied to all of the plurality of LEDs.

In some embodiment of the above LED light emitter, a ratio of the number of first LED dice to the number of second LED dice is equal to a ratio of two integers equal to or less than 9. In a specific embodiment, the number of first LED dice is twice the number of second LED dice. In another embodiment, each first LED die includes a blue light LED chip with a wavelength-converting layer disposed directly thereon.

According to another embodiment of the present invention, an LED light emitter includes a single emitter structure having a substrate with a plurality of light emitting diodes (LEDs) arranged thereon, wherein the plurality of LEDs includes at least one first LED die that produces a first color light, and at least one second LED die that produces a second color light. The LED light emitter also has a total internal reflection (TIR) lens positioned to collect light emitted from the single emitter structure and adapted to mix the light from the plurality of LEDs to produce a uniform light. In the emitter, plurality of LEDs are selected such that the light output by the LED light emitter has a desired color temperature when the number of first LED dice is twice the number of second LED dice, and an equal current is supplied to all of the plurality of LEDs.

In some embodiments of the above emitter, each of the plurality of first LEDs includes a blue light LED chip with a wavelength-converting layer disposed directly thereon, the wavelength-converting layer including a mixture of phosphor and silicone, no glue layer, or silicone layer no adhesion layer. In some embodiments, each of the plurality of second LEDs comprises an LED chip without wavelength-converting layer disposed thereon. In some embodiments, the LEDs are selected such that the light output by the lamp has a desired color temperature when an equal current is supplied to all of the plurality of LEDs. In a specific embodiment, each of the convex microlenses comprises a plurality of dimples. In another embodiment, each of the convex microlenses has a frosted surface formed by sand blasting the TIR lens.

Thus, although the invention has been described with respect to specific embodiments, it will be appreciated that the invention is intended to cover all modifications and equivalents within the scope of the following claims.

What is claimed is:

1. An LED (light-emitting diode) light emitter, comprising:
a single emitter structure having a substrate with a plurality of LED dies arranged thereon, wherein the plurality of LED dies includes at least one white LED die that produces a white light, and at least one red LED die that produces a red light,
wherein each white LED die includes a blue light LED chip with a wavelength-converting layer disposed directly thereon and each red LED die includes a red light LED chip; and
a total-internal-reflection (TIR) lens positioned to collect light emitted from the single emitter structure and adapted to mix the light from the plurality of LED dies to produce a uniform warm white light;
wherein the white LED dies are selected such that the light output by the LED light emitter has a desired color temperature when the number of white LED dies is twice the number of red LED dies, and an equal current is supplied to all of the plurality of LEDs;
wherein the plurality of LEDs consists of 16 white LED dies and eight red LED dies arranged symmetrically in a 5×5 grid, with four red LED dies placed in corners.

2. The LED light emitter of claim 1, wherein the white LED dies are selected such that a desired amount of wavelength-converting material is disposed directly on the blue light LED chip.

3. The LED light emitter of claim 1, wherein the white LED dies are selected to produce greenish white color with a desired amount of wavelength-converting material disposed directly on the blue light LED chip.

4. The LED light emitter of claim 1, wherein the TIR lens has a front surface having a plurality of convex microlenses thereon.

5. The LED light emitter of claim 4, wherein each of the convex microlenses comprises a plurality of dimples.

6. The LED light emitter of claim 5, wherein each of the convex microlenses comprises a plurality of dimples formed by sand blasting the TIR lens.

* * * * *